United States Patent
Yang

(10) Patent No.: US 11,520,195 B2
(45) Date of Patent: Dec. 6, 2022

(54) DISPLAY SUBSTRATE, DISPLAY PANEL AND DISPLAY DEVICE

(71) Applicant: Hubei Yangtze Industrial Innovation Center Of Advanced Display Co., Ltd., Wuhan (CN)

(72) Inventor: Chunhui Yang, Wuhan (CN)

(73) Assignee: Hubei Yangtze Industrial Innovation Center Of Advanced Display Co., Ltd., Wuhan (CN)

( * ) Notice: Subject to any disclaimer, the term of this patent is extended or adjusted under 35 U.S.C. 154(b) by 35 days.

(21) Appl. No.: 17/324,070

(22) Filed: May 18, 2021

(65) Prior Publication Data

US 2021/0271143 A1    Sep. 2, 2021

(30) Foreign Application Priority Data

Dec. 31, 2020    (CN) .......................... 202011632759.3

(51) Int. Cl.
*G02F 1/1345*    (2006.01)
*G02F 1/1362*    (2006.01)
*H01L 27/32*    (2006.01)

(52) U.S. Cl.
CPC .... *G02F 1/13458* (2013.01); *G02F 1/136254* (2021.01); *G02F 1/136286* (2013.01); *H01L 27/3276* (2013.01)

(58) Field of Classification Search
CPC .......... G02F 1/13452–13458; G02F 1/136286; G02F 1/136254
See application file for complete search history.

(56) References Cited

U.S. PATENT DOCUMENTS

| | | | |
|---|---|---|---|
| 5,757,450 A | 5/1998 | Fujii et al. | |
| 10,242,605 B2* | 3/2019 | Chen | H01L 24/81 |
| 2019/0245024 A1* | 8/2019 | Lim | H04N 9/3123 |

FOREIGN PATENT DOCUMENTS

JP    2005283831 A    10/2005

* cited by examiner

*Primary Examiner* — Dung T Nguyen
(74) *Attorney, Agent, or Firm* — Kilpatrick Townsend & Stockton, LLP

(57) ABSTRACT

Provided are a display substrate, a display panel and a display device. The display substrate includes a display area, a bezel area and multiple first signal lines. The bezel area includes a bonding area, the bonding area includes a first area and a second area, the first area includes first pads, and the second area includes second pads. The first signal lines are electrically connected to the first pads. Each of at least part of the first signal lines extends between respective two adjacent first pads. The second pads are dummy pads, or part of the second pads are electrically connected to a second signal line. The bonding area further includes multiple dummy traces, and at least part area of a dummy trace is disposed between two adjacent first pads, and/or between two adjacent second pads, and/or between a first pad and a second pad adjacent to each other.

20 Claims, 16 Drawing Sheets

DISPLAY SUBSTRATE, DISPLAY PANEL AND DISPLAY DEVICE

CROSS-REFERENCE TO RELATED APPLICATION

This application claims priority to Chinese Patent Application No. 202011632759.3 filed Dec. 31, 2020, the disclosure of which is incorporated herein by reference in its entirety.

FIELD

Embodiments of the present disclosure relate to the field of display technologies, and in particular to a display substrate, a display panel and a display device.

BACKGROUND

With the development of the display technology, the requirements of consumers for display panels are continuously increased, and various display panels emerge, such as a liquid crystal display panel and an organic light-emitting display panel.

The display panel generally includes a display area and a non-display area, the display area is provided with sub-pixels for displaying pictures, and the non-display area is provided with a structure such as a driving circuit for loading display driving signals. Among module processes of the display panel, a bonding process is a very important process. Pins of a driving chip or other functional elements are bonded to a pad disposed in the non-display area through the bonding process. When a resolution of the display panel is relatively high, in order to better match the process and the cost, multiple layers of pads are generally disposed for routing design, namely, the pads arranged in an array are disposed, and dummy pads without signal lines are reserved, resulting in different surface roughness in a bonding area. When the driving chip is bonded and the same pressure is applied, the bonding effect of the driving chip is different, which may cause poor bonding and even failure in part of areas.

SUMMARY

Embodiments of the present disclosure provide a display substrate, a display panel and a display device, to improve the process stability in a bonding process and improve the manufacturing yield of the display panel.

In one embodiment of the present disclosure provides a display substrate. The display substrate includes a display area, a bezel area and multiple first signal lines. The bezel area includes a bonding area, the bonding area includes a first area and a second area, the first area includes multiple first pads, the second area includes multiple second pads, the multiple first pads are arranged into a first pad array with at least two rows and at least two columns, and the multiple second pads are arranged into a second pad array with at least one row and at least two columns. Each of the multiple first signal lines is electrically connected to a respective one of the multiple first pads, and each of at least part of the multiple first signal lines extends between respective two adjacent first pads. Each of the multiple second pads is a dummy pad, or each of part of the multiple second pads is electrically connected to a respective one of second signal lines. The bonding area further includes multiple dummy traces, and at least part area of a dummy trace is disposed between two adjacent first pads, and/or between two adjacent second pads, and/or between a first pad and a second pad adjacent to each other.

In one embodiment of the present disclosure further provides a display panel including a display substrate. The display substrate includes a display area, a bezel area and multiple first signal lines. The bezel area includes a bonding area, the bonding area includes a first area and a second area, the first area includes multiple first pads, the second area includes multiple second pads, the multiple first pads are arranged into a first pad array with at least two rows and at least two columns, and the multiple second pads are arranged into a second pad array with at least one row and at least two columns. Each of the multiple first signal lines is electrically connected to a respective one of the multiple first pads, and each of at least part of the multiple first signal lines extends between respective two adjacent first pads. Each of the multiple second pads is a dummy pad, or each of part of the multiple second pads is electrically connected to a second signal line. The bonding area further includes multiple dummy traces, and at least part area of a dummy trace is disposed between two adjacent first pads, and/or between two adjacent second pads, and/or between a first pad and a second pad adjacent to each other.

In one embodiment of the present disclosure further provides a display device including a display panel and the display panel includes a display substrate. The display substrate includes a display area, a bezel area and multiple first signal lines. The bezel area includes a bonding area, the bonding area includes a first area and a second area, the first area includes multiple first pads, the second area includes multiple second pads, the multiple first pads are arranged into a first pad array with at least two rows and at least two columns, and the multiple second pads are arranged into a second pad array with at least one row and at least two columns. Each of the multiple first signal lines is electrically connected to a respective one of the multiple first pads, and each of at least part of the multiple first signal lines extends between respective two adjacent first pads. Each of the multiple second pads is a dummy pad, or each of part of the multiple second pads is electrically connected to a second signal line. The bonding area further includes multiple dummy traces, and at least part area of a dummy trace is disposed between two adjacent first pads, and/or between two adjacent second pads, and/or between a first pad and a second pad adjacent to each other.

The display substrate provided in the embodiments of the present disclosure includes the display area, the bezel area and the multiple first signal lines. The bezel area includes the bonding area, the bonding area includes the first area and the second area, the first area includes the multiple first pads, the second area includes the multiple second pads, the first pads are arranged into the first pad array with at least two rows and at least two columns, and the second pads are arranged into the second pad array with at least one row and at least two columns. Each of the first signal lines is electrically connected to a respective one of the first pads, and each of at least part of the first signal lines extends between respective two adjacent first pads. Each of the second pads is a dummy pad, or each of part of the second pads is electrically connected to a respective one of the second signal lines. The bonding area further includes the multiple dummy traces, and at least part area of a dummy trace is disposed between two adjacent first pads, and/or between two adjacent second pads, and/or between a first pad and a second pad adjacent to each other. The first pads are arranged into the first pad array with at least two rows and at least two columns, which is conducive to satisfying a process requirement for a high resolution. The first pads are electrically connected to the first signal lines, and the first signal lines may be connected to the display area to provide signals for display. The second pad array with at least one row and at least two columns is arranged, and the second pads serve as the dummy pads, or the part of the second pads are electrically connected to the second signal lines. The dummy trace is disposed between two adjacent first pads, and/or between two adjacent second pads, and/or between a first pad and a second pad adjacent to each other. Therefore, the surface roughness of different areas is balanced, the process stability in the bonding process is improved, and the manufacturing yield of the display panel is improved.

DETAILED DESCRIPTION

Figure 1:
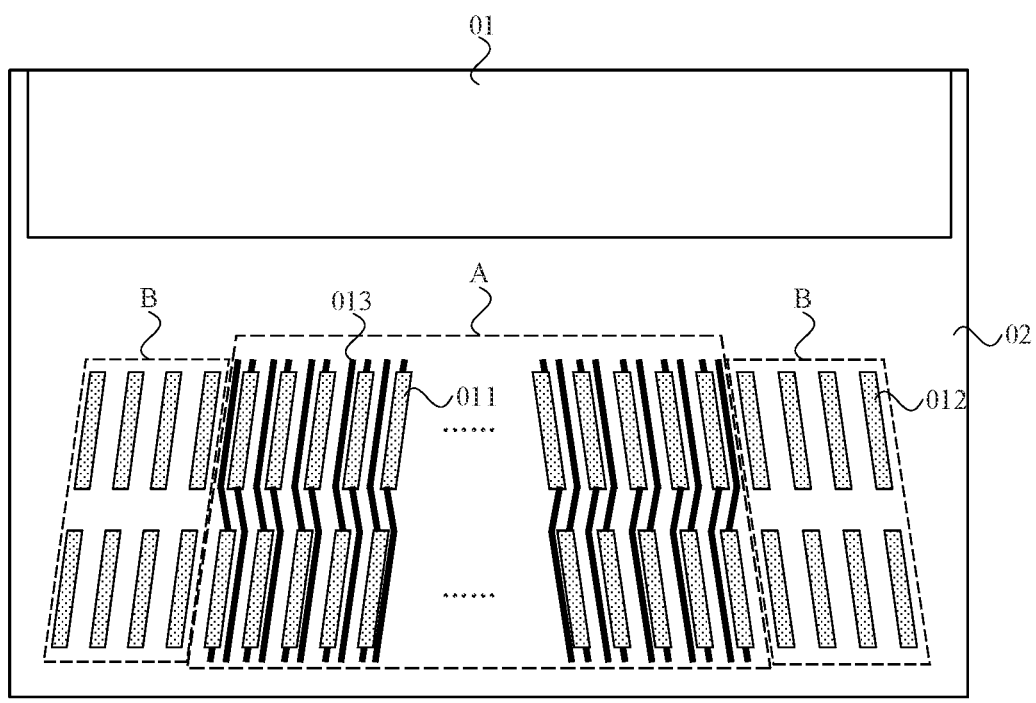
FIG. 1 is a schematic view of a partial structure of a display substrate in the related art.

The present disclosure will be further described in detail in conjunction with the drawings and embodiments below. It is to be understood that the embodiments described herein are merely used for explaining the present disclosure and are not intended to limit the present disclosure. It should also be noted that, for ease of description, only part, but not all, of the structures related to the present disclosure are shown in the drawings.

Terms used in the embodiments of the present disclosure are merely intended to describe embodiments and are not intended to limit the present disclosure. It should be noted that the nouns of locality such as "on", "below", "left" and "right" described in the embodiments of the present disclosure are described from the perspective of the drawings, and should not be understood as limiting the embodiments of the present disclosure. In addition, in this context, it should also be understood that when an element is formed "on" or "below" another element, it may not only be directly formed "on" or "below" another element, and may also be indirectly formed "on" or "below" another element through an intervening element. The terms "first", "second" and the like are only used for description, and do not represent any order, quantity, or importance, but only used for distinguishing different components.

Various modifications and variations may be made in the present disclosure without departing from the scope of the present disclosure. It is therefore intended to cover modifications and variations of the present disclosure which fall within the scope of the appended claims (claimed elements) and their equivalents. It should be noted that the embodiments provided in the embodiments of the present disclosure may be combined with each other without contradiction.

In the display field, a display screen is the most visualized man-machine interaction interface, and the manufacturing of the display screen is particularly important. A bonding process of a driving chip is an important procedure, and the driving chip is bonded to pads on a display substrate and configured to transmit signals into the screen, so that the bonding effect of the driving chip has a direct impact on the quality of the display screen. Exemplarily, FIG. 1 is a schematic view of a partial structure of a display substrate in the related art. Referring to FIG. 1, the display substrate includes a display area 01 and a bezel area 02; and the bezel area 02 includes an area A provided with multiple pads 011 and an area B provided with multiple pads 012, where the pads 011 are effective pads and are connected to signal lines 013, the pads 012 are dummy pads for reserving space for design (e.g., when signals need to be input and output from the dummy pads, pads are required to be available). When the pads are arranged in an array with at least two rows and at least two columns, the surface roughness of the area A is different from the surface roughness of the area B due to the signal line 013 being arranged between two adjacent pads 011. The surface roughness refers to the unevenness of relatively small intervals and small peaks and valleys of a machined surface, and is generally evaluated through a profile arithmetic mean deviation, called Ra for short, which is an arithmetic mean of absolute values of profile offset distances within the sampling length (lr). In the practical measurement, the more the number of measurement points, the more accurate the Ra is.

Since the surface roughness of the area A and the surface roughness of the area B are different, when a uniform pressure is used for bonding the driving chip, pressures borne by different areas are not equal, which easily leads to different bonding effects in the different areas during bonding and the reduction of the yield.

An embodiment of the present disclosure provides a display substrate, and the display substrate includes a display area, a bezel area and multiple first signal lines. The bezel area includes a bonding area, the bonding area includes a first area and a second area, the first area includes multiple first pads, the second area includes multiple second pads, the first pads are arranged into a first pad array with at least two rows and at least two columns, and the second pads are arranged into a second pad array with at least one row and at least two columns. The first signal lines are electrically connected to the first pads, and each of at least part of the first signal lines extends between respective two adjacent first pads; the second pads are dummy pads, or part of the second pads are electrically connected to second signal lines; the bonding area further includes multiple dummy traces, and at least part area of a dummy trace is disposed between two adjacent first pads, and/or between two adjacent second pads, and/or between a first pad and a second pad adjacent to each other.

According to the embodiment of the present disclosure, the first pads are arranged into the first pad array with at least two rows and at least two columns, which is conducive to satisfying a process requirement for a high resolution. The first pads are electrically connected to the first signal lines. Exemplarily, the first signal lines may be connected to the display area to provide signals for display or transmit control signals. The second pad array with at least one row and at least two columns is arranged, and the second pads serve as the dummy pads, or the part of the second pads are electrically connected to the second signal lines; the dummy trace is disposed between two adjacent first pads, and/or between two adjacent second pads, and/or between a first pad and a second pad adjacent to each other, so that the surface roughness of different areas is balanced, the process stability in the bonding process is improved, and the manufacturing yield of the display panel is improved.

The embodiments of the present disclosure will be described clearly and completely below in connection with the drawings in the embodiments of the present disclosure.

Figure 2:
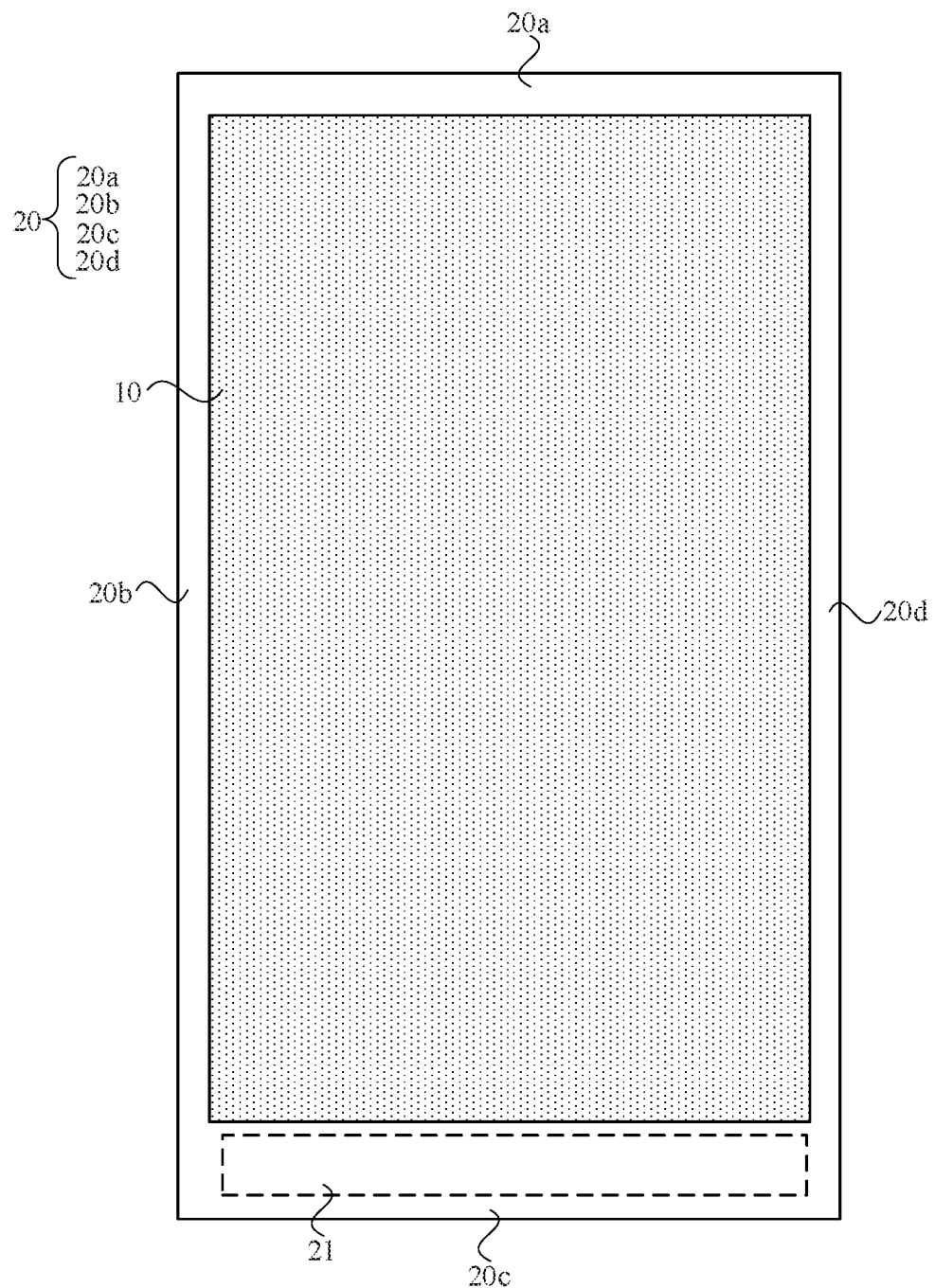
FIG. 2 is a schematic structural view of a display substrate according to an embodiment of the present disclosure.
Figure 3:
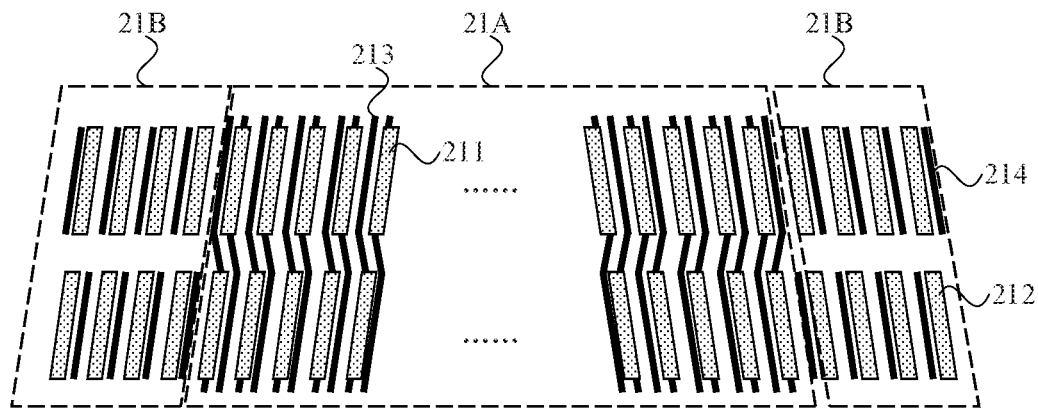
FIGS. 3 and 4 are each a schematic structural view of a bonding area in FIG. 2, respectively.
Figure 4:
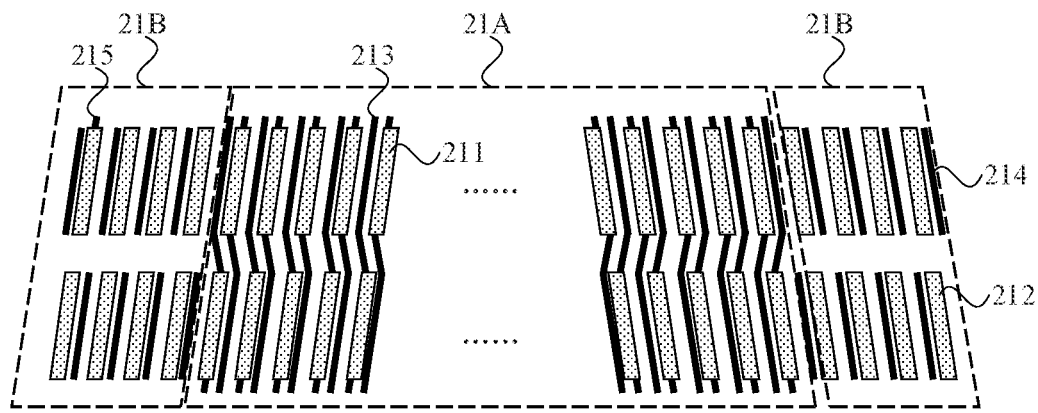

Exemplarily, FIG. 2 is a schematic structural view of a display substrate according to an embodiment of the present disclosure, and FIGS. 3 and 4 are each a schematic structural view of a bonding area in FIG. 2, respectively. Referring to FIG. 2, the display substrate provided in this embodiment includes a display area 10 and a bezel area 20. The display area 10 is provided with sub-pixels (not shown in FIG. 2) arranged in an array. FIG. 2 schematically shows that the shape of the display substrate is rectangular, the bezel area 20 includes an upper bezel 20a, a left bezel 20b, a lower bezel 20c and a right bezel 20d, and the location of the bonding area 21 in the lower bezel 20c is only illustrative and is not a limitation to the embodiments of the present disclosure. Referring to FIG. 3, the bonding area 21 includes a first area 21A and a second area 21B, the first area 21A includes multiple first pads 211, the first pads 211 are arranged into a first pad array with two rows and multiple columns, the second area 21B includes multiple second pads 212, and the second pads 212 are also schematically arranged into a second pad array with two rows and multiple columns. The display substrate further includes multiple first signal lines 213, the first signal lines 213 are electrically connected to the first pads 211, and the first signal line 213 may extend between two adjacent first pads 211. The second pads 212 are dummy pads, the bonding area 21 further includes multiple dummy traces 214, the dummy trace 214 is disposed between two adjacent pads, and two adjacent pads include at least one of the following: two adjacent first pads 211, two adjacent second pads 212, or a first pad 211 and a second pad 212 adjacent to each other. In one embodiment, referring to FIG. 4, the second pad 212 in the first row and the first column is electrically connected to a second signal line 215, the first signal lines 213 and the second signal line 215 may be configured to provide signals, and the first signal lines 213 and the second signal line 215 are represented by traces that extend beyond edges of the pads in FIGS. 3 and 4.

It should be noted that the first pad array and the second pad array shown in FIGS. 3 and 4 each including two rows are only schematic. In other embodiments, the first pad array includes at least two rows of pads, and the second pad array may include a single row and multiple columns, which can be designed according to practical situations in the specific implementation and not limited in the embodiments of the present disclosure. During the specific implementation, the first signal lines 213, the dummy traces 214 and the second signal line 215 may be disposed in a same trace layer or different trace layers, which may be flexibly selected according to practical process conditions during the specific implementation.

The display substrate provided in this embodiment may be applied to a liquid crystal display panel. The liquid crystal display panel generally includes a color filter (CF) substrate, a thin film transistor (TFT) array substrate, and a liquid crystal layer disposed between the CF substrate and the array substrate. The display substrate provided in this embodiment may be the array substrate of the liquid crystal display panel, and the operation principle thereof is as follows: liquid crystal molecules in the liquid crystal layer are controlled to rotate by applying a driving voltage, and a light source provided by a backlight module penetrates through the TFT array substrate of the liquid crystal display panel, is refracted out of the liquid crystal layer of the liquid crystal display panel, and generates a color picture through the CF substrate.

In other embodiments, the display substrate may be applied to an organic light-emitting display panel, a display area is correspondingly provided with an organic light-emitting structure to achieve the display of a picture, and an area corresponding to a non-display area does not display a picture. The display substrate includes a base, and the base may be flexible and may be formed of any suitable insulating material having flexibility. For example, the flexible base may be formed of a polymeric material such as polyimide (PI), polycarbonate (PC), polyether sulfone (PES), polyethylene terephthalate (PET), polyethylene naphthalate (PEN), polyarylate (PAR), or fiberglass glass fiber reinforced plastic (FRP). The base may be transparent, translucent, or opaque.

A buffer layer may be disposed on the base, and the buffer layer covers the entire upper surface of the flexible base. In a certain embodiment, the buffer layer may include an inorganic layer or an organic layer. For example, the buffer layer may be formed of a material selected from inorganic materials such as silicon oxide (SiOx), silicon nitride (SiNx), silicon oxynitride (SiOxNy), aluminum oxide (AlOx) or aluminum nitride (AlNx), or selected from organic materials such as acryl, PI, or polyester. The buffer layer may include a single layer or multiple layers. The buffer layer may serve to block oxygen and moisture, prevent moisture or impurities from diffusing through the base, and provide a flat surface on the upper surface of the flexible base.

The display substrate may further include a TFT disposed on the buffer layer. A top gate type TFT is used as an example. The TFT includes a semiconductor active layer disposed on the buffer layer, and the semiconductor active layer includes a source area and a drain area which are formed by doping N-type impurity ions or P-type impurity ions. An area between the source area and the drain area is a channel area in which no impurity is doped.

The semiconductor active layer may be formed by changing amorphous silicon to polycrystalline silicon by crystallization of the amorphous silicon. In order to crystalize the amorphous silicon, various methods such as a rapid thermal annealing (RTA) method, a solid phase crystallization (SPC) method, an excimer laser annealing (ELA) method, a metal induced crystallization (MIC) method, a metal induced lateral crystallization (MILC) method, or a sequential lateral solidification (SLS) method may be utilized.

A gate insulating layer includes an inorganic layer such as silicon oxide, silicon nitride, or metal oxide, and may include a single layer or multiple layers.

A gate electrode is disposed in a specific area on the gate insulating layer. The gate electrode may include a single layer or multiple layers made of gold (Au), silver (Ag), copper (Cu), nickel (Ni), platinum (Pt), palladium (Pd), aluminum (Al), molybdenum (Mo), or chromium (Cr), or an alloy such as aluminum (Al): neodymium (Nd) alloy, or molybdenum (Mo): tungsten (W) alloy.

An interlayer insulating layer is disposed on the gate electrode. The interlayer insulating layer may be formed of an insulating inorganic layer such as silicon oxide or silicon nitride. In an embodiment, the interlayer insulating layer may be formed of an insulating organic layer.

A source electrode and a drain electrode are disposed on the interlayer insulating layer. The source electrode and the drain electrode are electrically connected (or combined) to the source area and the drain area through contact holes, respectively, and the contact holes may be formed by selectively removing the gate insulating layer and the interlayer insulating layer.

A passivation layer is disposed on the source electrode and the drain electrode. The passivation layer may be formed of an inorganic layer such as silicon oxide or silicon nitride, or may be formed of an organic layer. A planarization layer is disposed on the passivation layer. The planarization layer includes an organic layer such as acryl, PI, benzocyclobutene (BCB).

The organic light-emitting structure is formed on the TFT and disposed within the display area 10 of the display substrate, and generally includes a first electrode, a light-emitting layer and a second electrode. In order to form the organic light-emitting structure, the first electrode (anode) is electrically connected (or combined) to the source electrode or the drain electrode through a contact hole. The first electrode serves as the anode and may be formed of various conductive materials. For example, the first electrode may be formed as a transparent electrode or a reflective electrode according to the use of the first electrode. When the first electrode is formed as the transparent electrode, the first electrode may include indium tin oxide (ITO), indium zinc oxide (IZO), zinc oxide (ZnO), indium oxide (In2O3), or the like. When the first electrode is formed as the reflective electrode, a reflective layer may be formed of Ag, magnesium (Mg), Al, Pt, Pd, Au, Ni, Nd, iridium (Ir), Cr, or a mixture thereof, and the ITO, IZO, ZnO, In2O3, or the like may be formed on the reflective layer.

A pixel defining layer (PDL) is disposed on the planarization layer to cover the edge of the first electrode. In a certain embodiment, the PDL around the edge of the first electrode defines an emission area of each sub-pixel. The PDL may be formed of an organic material such as PI, polyamide, BCB, acrylic resin or phenolic resin.

The light-emitting layer is disposed on the first electrode, and a portion of the first electrode on which the light-emitting layer is disposed is not covered by the PDL and exposed. The light-emitting layer may be formed by a vapor deposition process, and the light-emitting layer is patterned to correspond to each sub-pixel, i.e., correspond to the patterned first electrode.

The light-emitting layer may be formed of a low molecular weight organic material or a high molecular weight organic material, and the light-emitting layer includes an organic emission layer, and may further include at least one of a hole injection layer (HIL), a hole transport layer (HTL), an electron transport layer (ETL), or an electron injection layer (EIL). The light-emitting layer may further include other various functional layers in addition to the organic emission layer.

The second electrode (serving as the cathode of the organic light-emitting structure OLED) is disposed on the light-emitting layer. Similar to the first electrode, the second electrode may be formed as a transparent electrode or a reflective electrode. The first electrode and the second electrode are insulated from each other by the light-emitting layer. If a voltage is applied between the first electrode and the second electrode, then the light-emitting layer emits visible light, to achieve an image recognizable by a user.

When the second electrode is formed as the transparent electrode, a compound having a small work function, such as lithium (Li), calcium (Ca), lithium fluoride/calcium fluoride (LiF/CaF2), lithium fluoride/aluminum fluoride (LiF/A1F3), aluminum (Al), magnesium (Mg), or a combination thereof, may be initially deposited on the light-emitting layer by evaporation, and a material for forming the transparent electrode, such as ITO, IZO, ZnO, or In2O3 may be deposited on this compound. When the second electrode is formed as the reflective electrode, the second electrode may be formed by evaporating Li, Ca, LiF/CaF2, LiF/A1F3, Al, Mg, or a mixture thereof on the entire surface of the substrate.

In another embodiment, at least part of the dummy traces 214 are electrically connected to the second pads 212.

Figure 5:
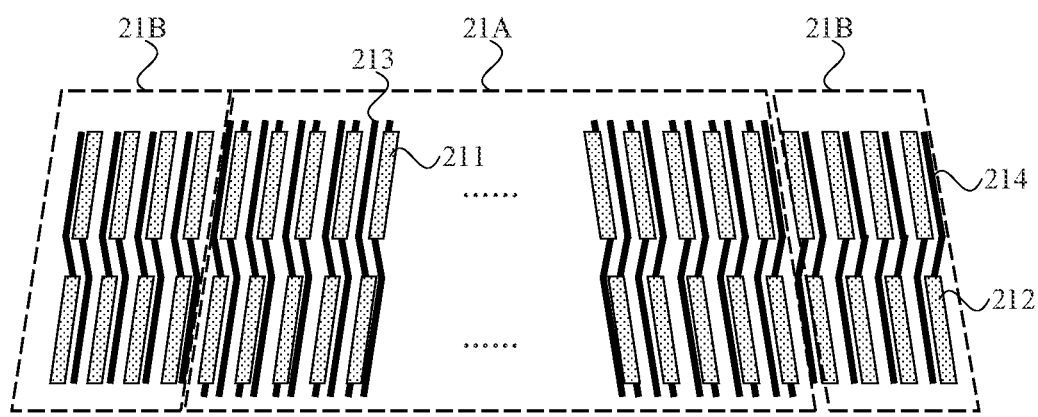
FIG. 5 is another schematic structural view of the bonding area in FIG. 2.
Figure 6:
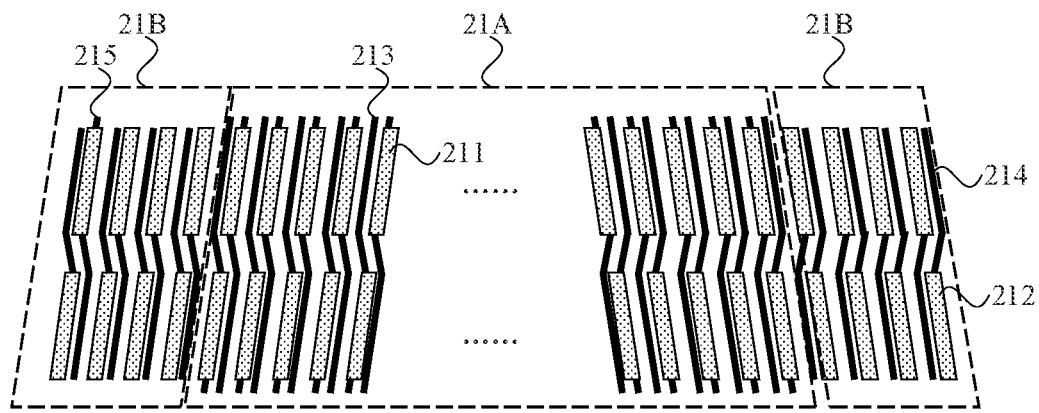
FIGS. 6 and 7 are each another schematic structural view of the bonding area in FIG. 2, respectively.
Figure 7:
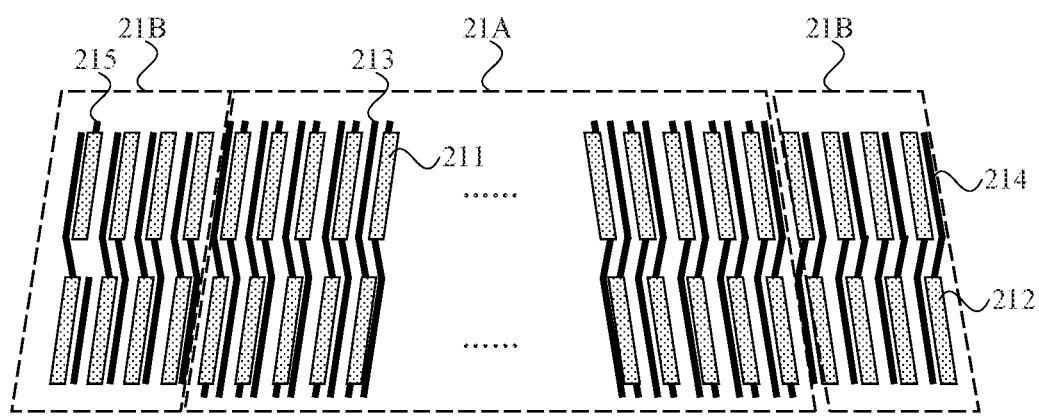

Exemplarily, FIG. 5 is another schematic structural view of the bonding area in FIG. 2. Referring to FIG. 5, all the dummy traces 214 in the second area 21B are connected to the second pads 212. This design may keep the regularity of routing design of the bonding area, so that the traces in the first area 21A and the second area 21B are kept consistent as much as possible, and the difficulty in design and manufacturing is reduced while the surface roughness is balanced. On the basis of the embodiments of FIGS. 3 to 5, FIGS. 6 and 7 are each another schematic structural view of the bonding area in FIG. 2, respectively. Referring to FIG. 6, the second pad 212 in the first row and the first column is connected to the second signal line 215, and the other second pads 212 are connected to the dummy traces 214. Referring to FIG. 7, the difference from FIG. 6 is that the second pad 212 in the first row and the first column is not connected to the dummy trace 214 in the second row. In the specific implementation, as long as dummy traces are not connected to other signals at upper ends of second pads 212 in the first row, it can be considered that the dummy traces still belong to a category of dummy traces; as long as dummy traces are not connected to other signals at lower ends of second pads 212 in the last row (the second row), it can be considered that the dummy traces still belong to the category of dummy traces. How many second pads 212 serve as effective pads and how the second signal lines 215 are routed are not limited in the embodiments of the present disclosure.

Figure 8:
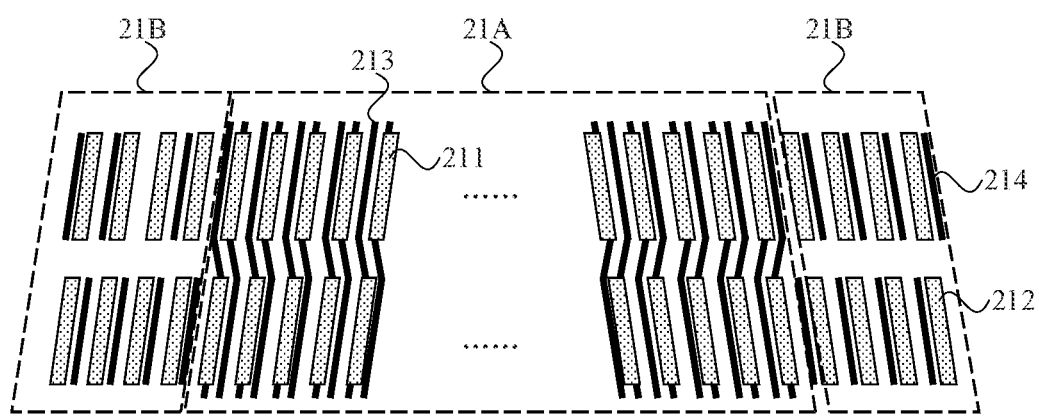
FIG. 8 is another schematic structural view of the bonding area in FIG. 2.

In the embodiments of FIGS. 3 to 7, a trace (at least one of the first signal line 213, the dummy trace 214, or the second signal line 215) is arranged between every two adjacent pads (two adjacent first pads 211, two adjacent second pads 212, and the first pad 211 and the second pad 212 adjacent to each other) in a same row. In other embodiments, no traces may be provided between part of adjacent pads. Exemplarily, FIG. 8 is another schematic structural view of the bonding area in FIG. 2. Referring to FIG. 8, no dummy trace 214 is arranged between the second pad 212 in the first row and the second column and the second pad 212 in the first row and the third column. In this way, routing space can be reserved for other wires in some cases, and in general, the design of no dummy trace 214 between individual second pads 212 has relatively little impact on the overall bonding effect. A flexible design may be implemented according to practical situations in the specific implementation.

In an embodiment, at least two second pads 212 are electrically connected by the dummy trace 214.

Figure 9:
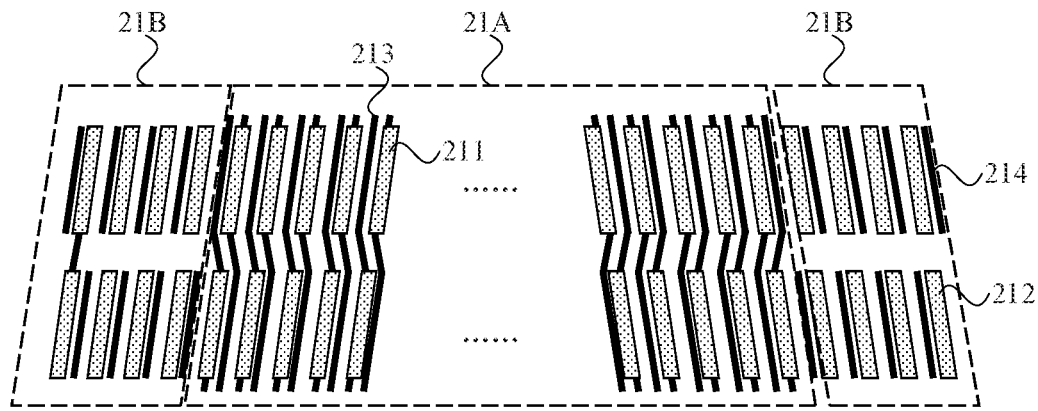
FIG. 9 is another schematic structural view of the bonding area in FIG. 2.
Figure 10:
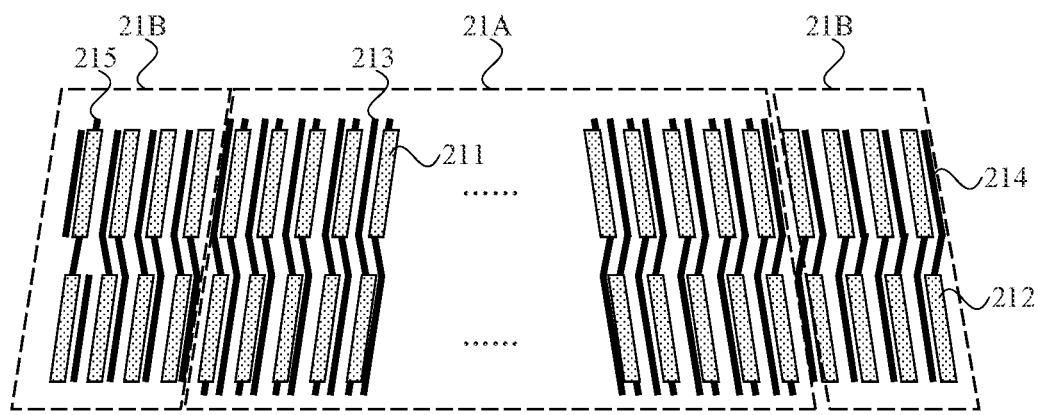
FIGS. 10 to 14 are each another schematic structural view of the bonding area in FIG. 2, respectively.
Figure 11:
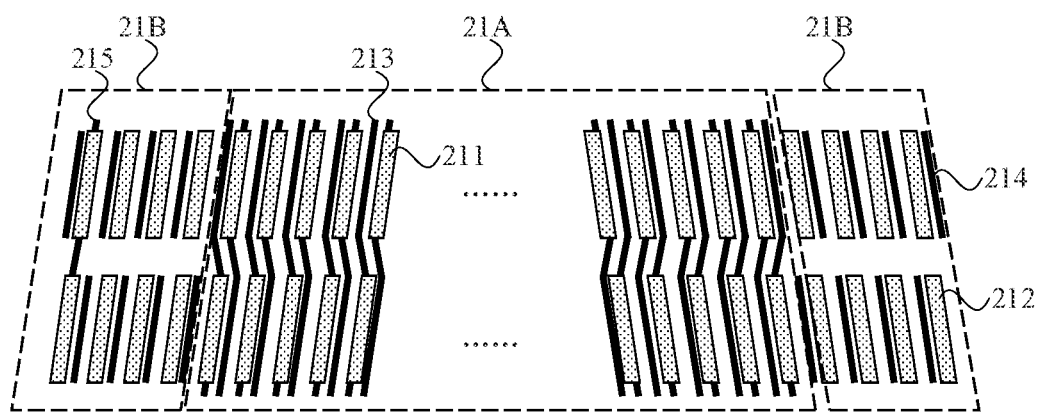
Figure 12:
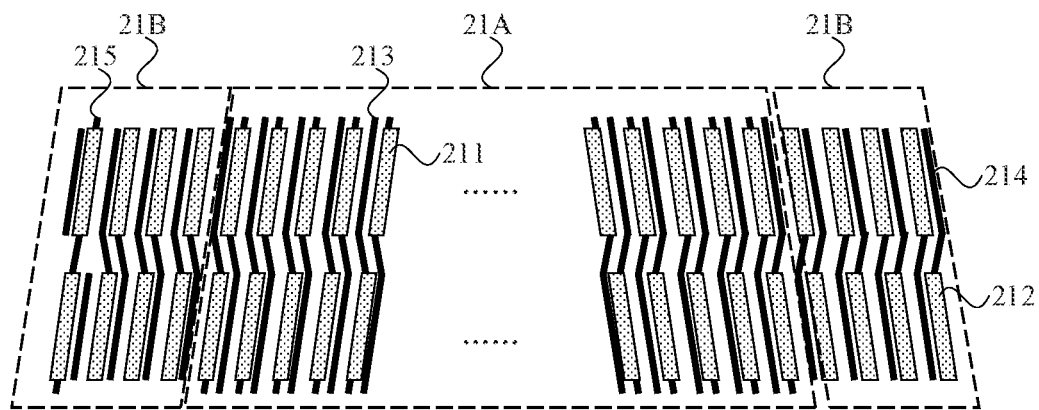
Figure 13:
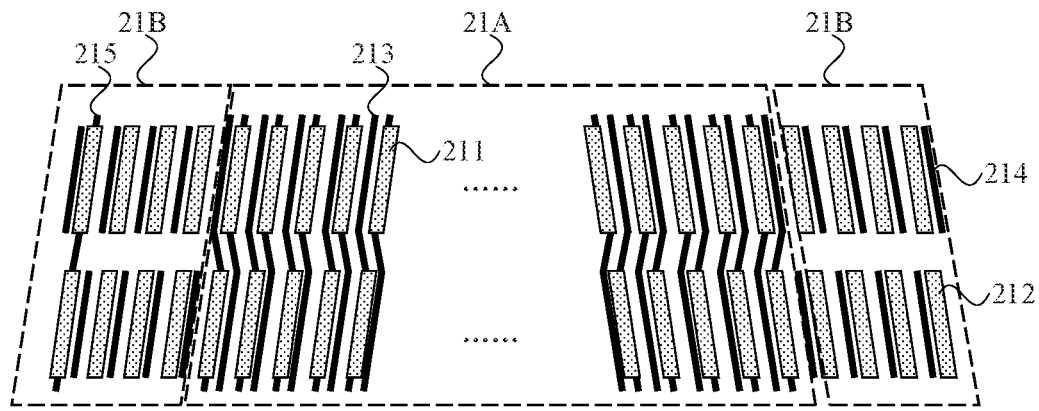
Figure 14:
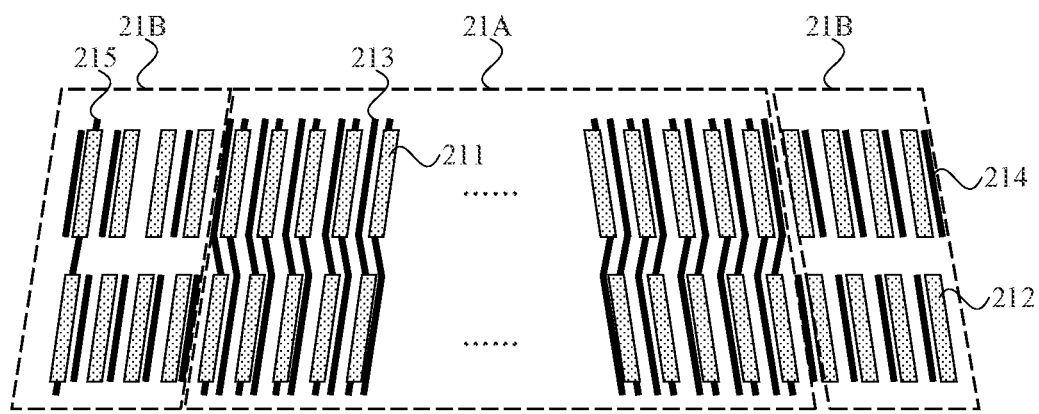

It is to be understood that, in general, the second pad 212 serves as the dummy pad and is not configured to transmit signals, so that part of the second pads 212 may be connected by the dummy traces 214. Compared with a case that no dummy trace is arranged between two columns of pads, the dummy trace 214 is arranged to connect two second pads 212, which is conducive to improving the regularity of the routing design of the bonding area and thus improving the bonding effect. Exemplarily, FIG. 9 is another schematic structural view of the bonding area in FIG. 2. In this embodiment, all the second pads 212 serve as the dummy pads, and the second pad 212 in the first row and the first column is connected to the second pad 212 in the second row and the first column through the dummy trace 214. Since all the second pads 212 serve as the dummy pads, the display substrate is not affected by the electrical connection of part of the second pads 212. In other embodiments, part of the second pads 212 may be connected to dummy pads when serving as effective pads, and thus the regularity of the bonding area is improved on a basis that signals in the display substrate are not affected. FIGS. 10 to 14 are each another schematic structural view of the bonding area in FIG. 2, respectively. In FIGS. 10 to 14, the connection between the second pad in the first row and the first column and the second pad in the first row and the second column is used as an example, which is not to limit the embodiments of the present disclosure, and may be designed according to practical situations in the specific implementation.

Figure 15:
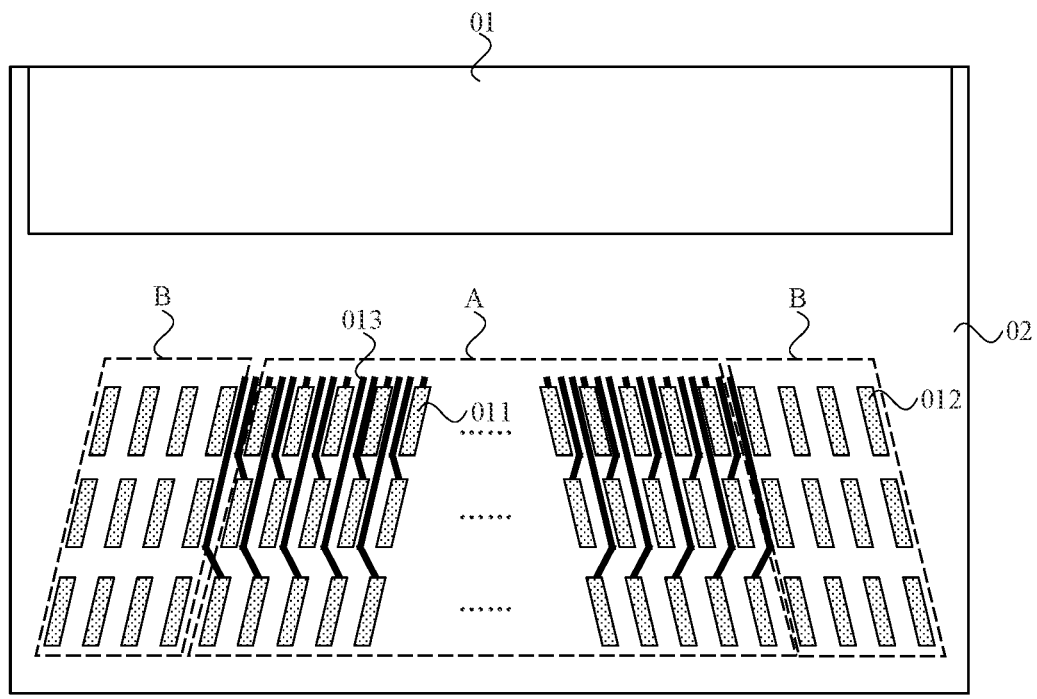
FIG. 15 is another schematic view of a partial structure of a display substrate in the related art.
Figure 16:
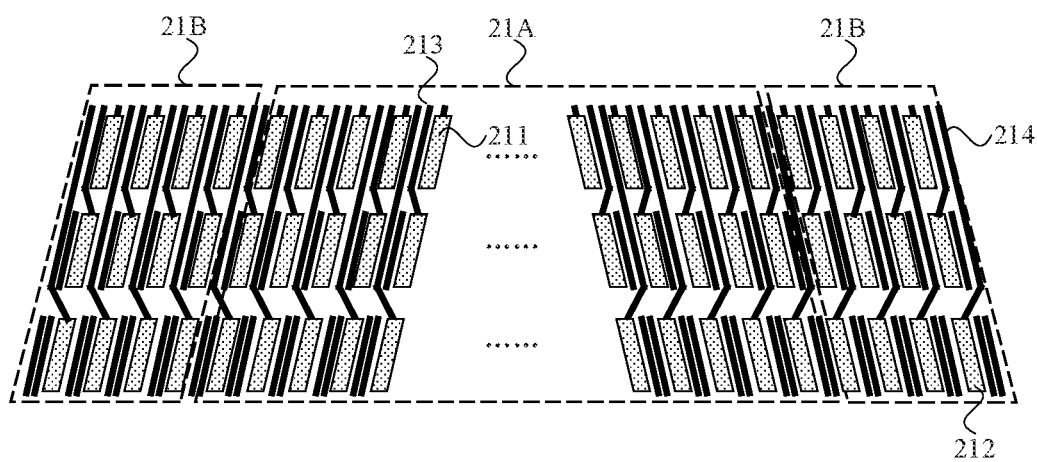
FIGS. 16 to 19 are each another schematic structural view of the bonding area in FIG. 2, respectively.
Figure 17:
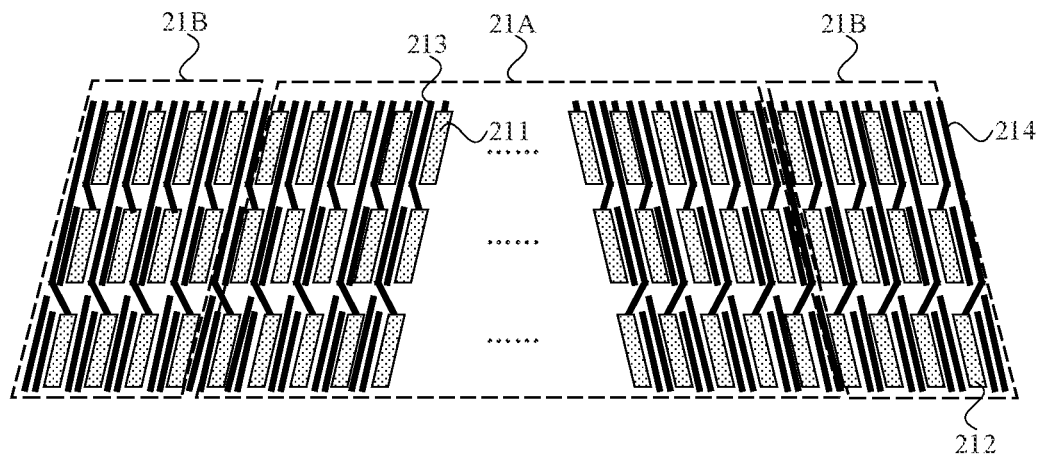
Figure 18:
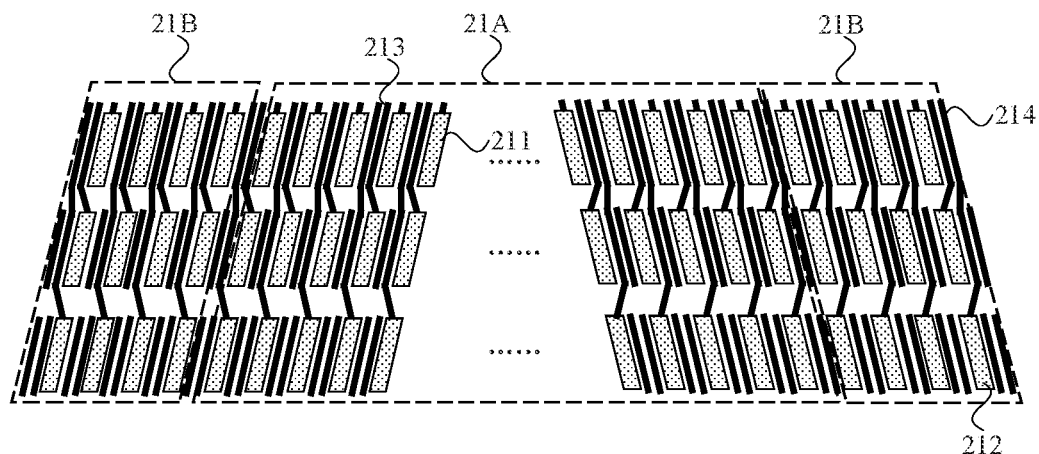

When the number of rows of the pad array is larger than 2, the surface roughness of areas where different pads are located changes more obviously. Exemplarily, FIG. 15 is another schematic view of a partial structure of a display substrate in the related art. Referring to FIG. 15, a pad array including three rows is used as an example, two signal lines 013 are included between every two pads 011 in the first row of the area A, one signal line 013 is included between every two pads 011 in the second row of the area A, and no signal line exists between every two pads 011 in the third row of the area A, resulting in different surface roughness at different positions in the area A.

Similar to the embodiments described above, in an embodiment, a column direction of the first pad array and a column direction of the second pad array are the same, and an extending direction of the dummy traces 214 is parallel to the column direction of the first pad array; a dummy trace disposed in a certain row of the first pad array or a certain row of the second pad array is electrically connected to a second pad 212 disposed in a previous row; and/or, a dummy trace 214 disposed in a certain row of the first pad array or a certain row of the second pad array is electrically connected to a second pad 212 disposed in a next row. The dummy traces 214 is arranged to be connected to the second pad 212 disposed in the previous row or to the second pad 212 disposed in the next row, so that a certain number of dummy traces may further be designed between the two columns of pads, which is conducive to improving the regularity of the routing design of the bonding area and thus improving the bonding effect.

It is to be understood that the first pad 211 and the second pad 212 are designed to be strip-shaped, such as rectangular or parallelogram, a long side of the first pad 211 is parallel to the column direction of the first pad array, a short side of the first pad 211 is parallel to a row direction of the first pad array, and the second pad 212 is arranged in the same way as the first pad 211. The first pad array and the second pad array may be served as a whole pad array. In this way, an interval between two adjacent rows of first pads 211 (two adjacent rows of second pads 212) is relatively small, and when the driving chip is bonded to the pads, a probability of contact between the driving chip and an area between two rows of pads is relatively less, so that dummy traces may be arranged between two adjacent rows of pads, or no dummy traces may be arranged between two adjacent rows of pads. The length between two adjacent columns of pads is relatively long, so that a probability of contact when the driving chip is bonded is relatively great. Therefore, in this embodiment, a direction of the dummy traces 214 is parallel to the column direction of the first pad array, so that the surface roughness of the first area 21A where the first pads 211 are disposed and the surface roughness of the second area 21B where the second pads 212 are disposed are effectively balanced, and thus the stability of the bonding process is improved.

Figure 19:
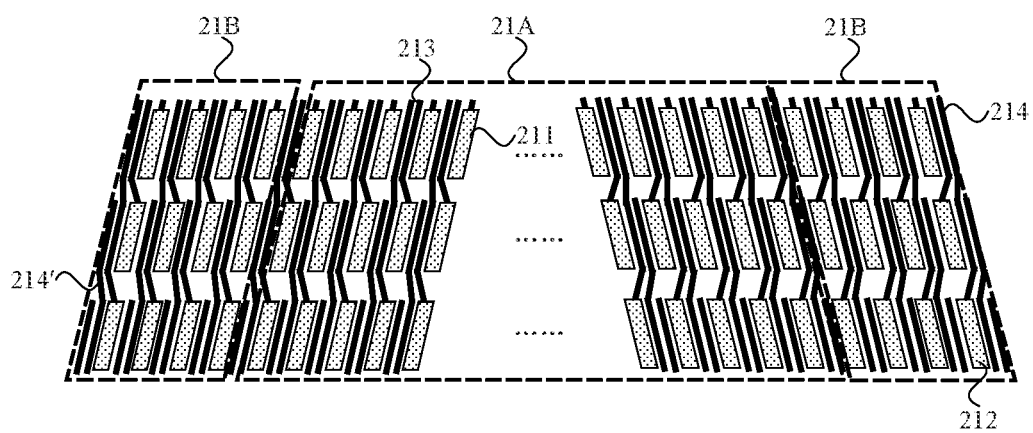
Figure 20:
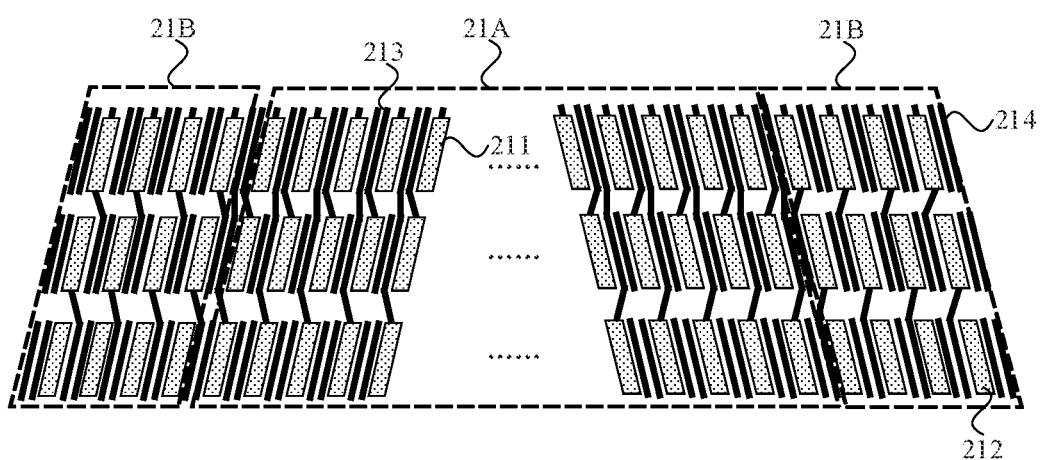
FIGS. 20 to 22 are each another schematic structural view of the bonding area in FIG. 2, respectively.
Figure 21:
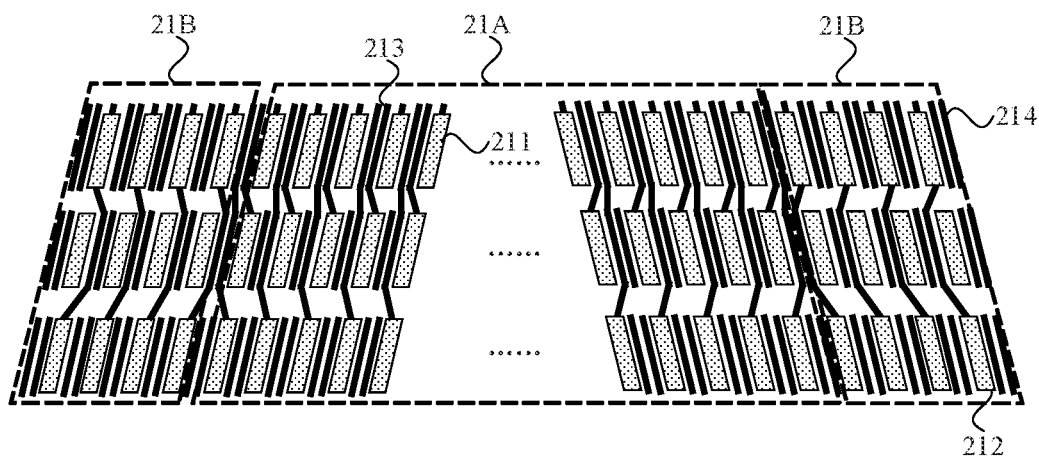
Figure 22:
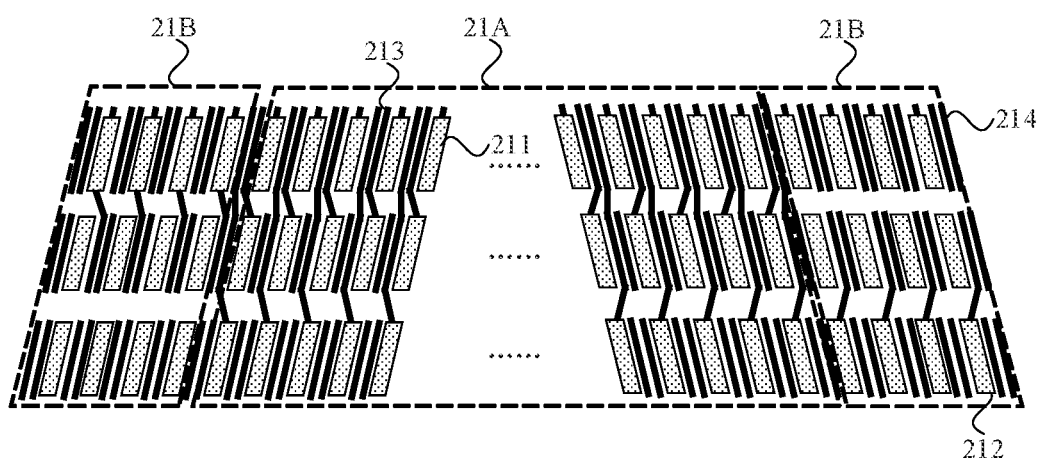

Exemplarily, FIGS. 16 to 19 are each another schematic structural view of the bonding area in FIG. 2, respectively. Referring to FIGS. 16 to 19, a same routing design is adopted for the first area 21A and the second area 21B, except that traces in the second area 21B are not connected to other signals (an effective area is connected to a corresponding second signal line when part of the second pads 212 serve as effective pads). Any two traces may be traces disposed on a same film layer or traces disposed on different film layers, and a material of the specific traces and a relation of the film layers are not limited in the embodiments of the present disclosure. FIGS. 16 to 19 schematically show that part of the dummy traces 214 are electrically connected to second pads 212 in a next row (e.g., dummy traces connected to second pads in the second row). In other embodiments, dummy traces may be electrically connected to second pads in a previous row, or dummy traces may be arranged independently and may not be electrically connected to the second pads, which may be selected flexibly according to a practical routing design. Exemplarily, FIGS. 20 to 22 are each another schematic structural view of the bonding area in FIG. 2, respectively. Referring to FIG. 20, part of dummy traces 214 disposed in the second row of the second pad array are connected to second pads 212 in the first row, and part of dummy traces 214 disposed in the third row of the second pad array are connected to second pads 212 in the second row. Referring to FIG. 21, part of dummy traces 214 disposed in the second row of the second pad array are connected to both second pads 212 in the first row and second pads 212 in the third row. Referring to FIG. 22, part of the dummy traces 214 disposed in the second row of the second pad array are connected to second pads 212 in the first row, and part of the dummy traces 214 are connected to second pads 212 in the third row. The embodiments shown in FIGS. 20 to 22 may achieve similar effects as the embodiments shown in FIGS. 16 to 19.

Figure 23:
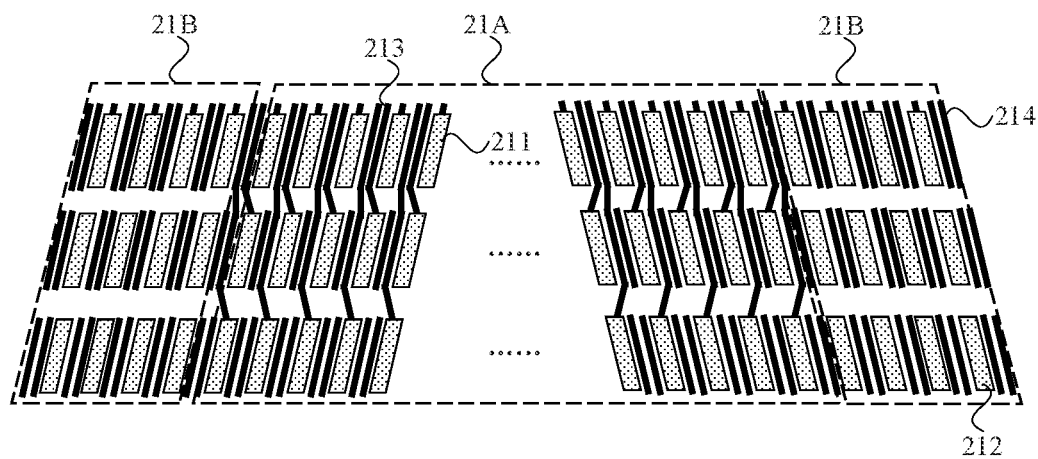
FIG. 23 is another schematic structural view of the bonding area in FIG. 2.

In other embodiments, different routing designs are adopted for the first area 21A and the second area 21B. Exemplarily, FIG. 23 is another schematic structural view of the bonding area in FIG. 2. Referring to FIG. 23, dummy traces 214 in the second area 21B are distributed in an array similar to the array of the second pads 212, and the length of the dummy trace 214 is approximately equal to the length of the second pad 212; in the first area 21A, no dummy trace 214 is arranged between every two adjacent first pads 211 in the first row (two first signal lines 213 are included between every two adjacent first pads 211 in the first row), one dummy trace 214 is arranged between every two adjacent first pads 211 in the second row (one first signal line 213 is included between every two adjacent first pads 211 in the second row), and two dummy traces are disposed between every two adjacent first pads 211 in the third row.

In an embodiment, the number of traces between two adjacent first pads 211 is the same as the number of traces between two adjacent second pads 212, so that the consistency of the surface roughness of the first area 21A and the second area 21B can be ensured, and the bonding effect can be improved.

Schematically, with continued reference to FIGS. 16 to 23, two traces are included between every two adjacent first pads 211, and two dummy traces 214 are included between every two adjacent second pads 212 (an example in which all the second pads 212 are the dummy pads is used, if at least part of the second pads 212 include effective pads, then part of the traces are second signal lines). It should be noted that two traces are also arranged between the first pad 211 and the second pad 212 which are at the boundary position of the first area 21A and the second area 21B, where a specific routing design is similar to the routing design between two adjacent first pads 211 or two adjacent second pads 212.

In an embodiment, the traces between two adjacent first pads include at least one of the first signal lines 213, or the traces between two adjacent first pads include at least one of the dummy traces 214, or the traces between two adjacent first pads include at least one of the first signal lines 213 and at least one of the dummy traces 214; and the traces between two adjacent second pads 212 include at least one of the second signal lines 215, or the traces between two adjacent second pads 212 include at least one of the dummy traces 214, or the traces between two adjacent second pads 212 include at least one of the second signal lines 215 and at least one of the dummy traces 214.

With continued reference to FIG. 23, only the first signal lines 213 are included between every two adjacent first pads 211 in the first row, only the dummy traces 214 are included between every two adjacent first pads 211 in the third row, and one first signal line 213 and one dummy trace 214 are included between every two adjacent first pads 211 in the second row. In other embodiments, for example, when more rows of pads are included to form a pad array, traces between two adjacent pads are correspondingly increased. It is to be understood that in the embodiment of FIG. 23, the traces between every two adjacent second pads 212 are dummy traces 214. When part of the second pads 212 serve as effective pads, the traces between two adjacent second pads 212 further include a second signal line.

In an embodiment, the length of part of the dummy traces is greater than or equal to the length of two rows of pads in the first pad array and/or the second pad array in the column direction.

In the embodiment of FIG. 23, the length of the dummy trace 214 is approximately equal to the length of the second pad 212, i.e., one dummy trace 214 corresponds to one second pad 212. In some embodiments, longer dummy traces 214 may also be designed, e.g., one dummy trace corresponds to two rows of pads. Referring to FIG. 19, the leftmost second dummy trace 214' corresponds to the second pad 212 disposed in the second row and the second pad 212 disposed in the third row, and the length of the leftmost second dummy trace 214' corresponds to two rows of pads, which can reduce the number of the dummy traces 214. Moreover, traces are further provided in the area between two adjacent rows of pads, which can make the roughness of the bonding area more uniform.

In an embodiment, the second area includes a first sub-area and a second sub-area, the first sub-area is disposed on a first side of the first area, and the second sub-area is disposed on a second side of the first area; and the first sub-area, the first area and the second sub-area are sequentially arranged in the row direction of the first pad array.

Figure 24:
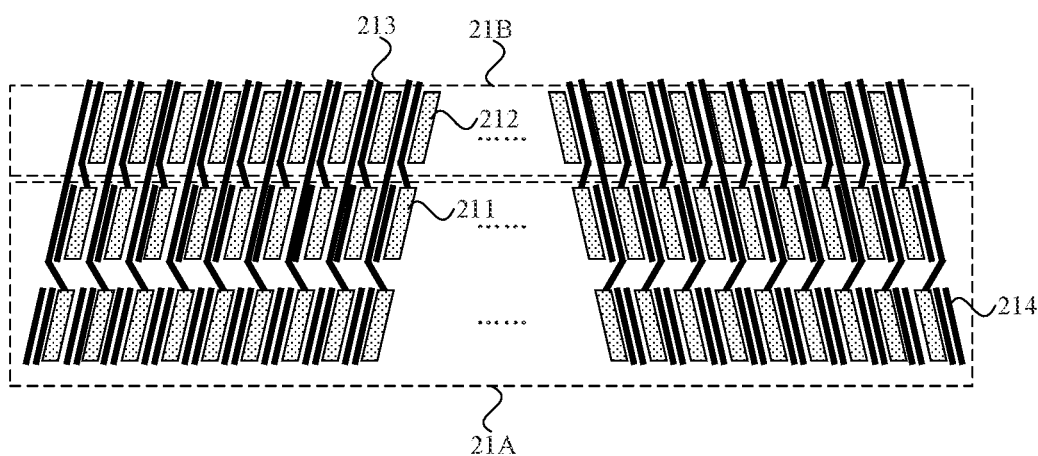
FIG. 24 is another schematic structural view of the bonding area in FIG. 2.

In the embodiments described above, the first sub-area and the second sub-area are disposed on the left and right sides of the first area, respectively, i.e., the second pads 212 are arranged on the left and right sides of the first pads 211. In other embodiments, the second pads 212 may be arranged on at least one of the upper or lower sides of the first pads 211. In an embodiment, the second area is disposed on a side of the first area away from or close to the display area. Exemplarily, FIG. 24 is another schematic structural view of the bonding area in FIG. 2, the difference from the embodiments described above in which the second area 21B is disposed on two sides of the first area 21A, in this embodiment, the second area 21B is disposed on a side of the first area 21A close to the display area. It is to be understood that in this embodiment, since the first signal lines 213 are primarily included between the second pads 212, in order to balance the roughness of different areas, the dummy traces 214 are primarily disposed between two adjacent first pads 211.

Figure 25:
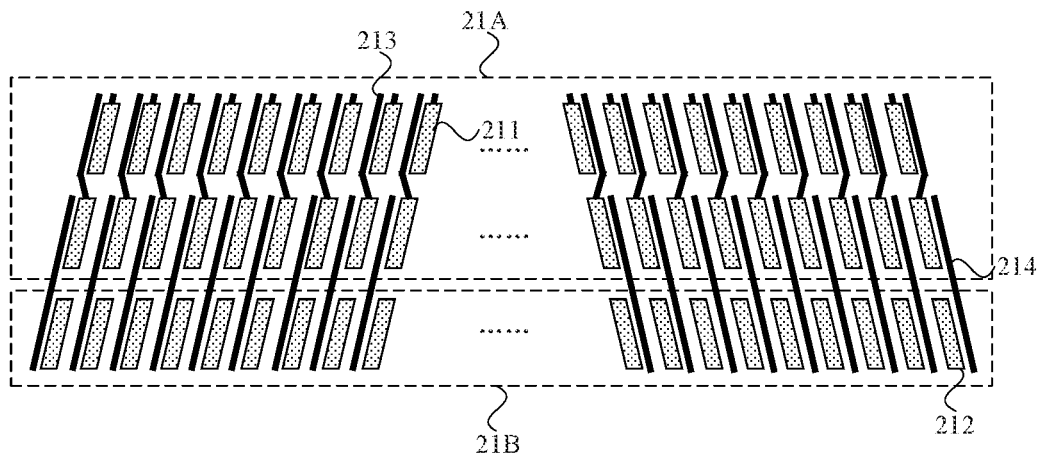
FIG. 25 and FIG. 26 are each another schematic structural view of the bonding area in FIG. 2, respectively.
Figure 26:
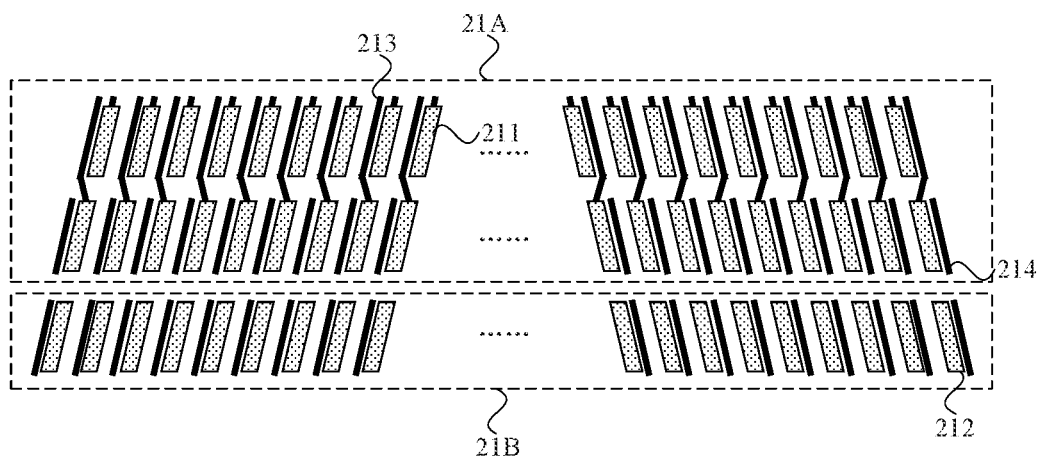

Exemplarily, FIG. 25 and FIG. 26 are each another schematic structural view of the bonding area in FIG. 2, respectively. In FIG. 25 and FIG. 26, an example in which the second area is disposed on a side of the first area away from the display area is used, the dummy traces 214 are arranged to balance the surface roughness of each area, and thus the process stability of the bonding process is improved.

Figure 27:
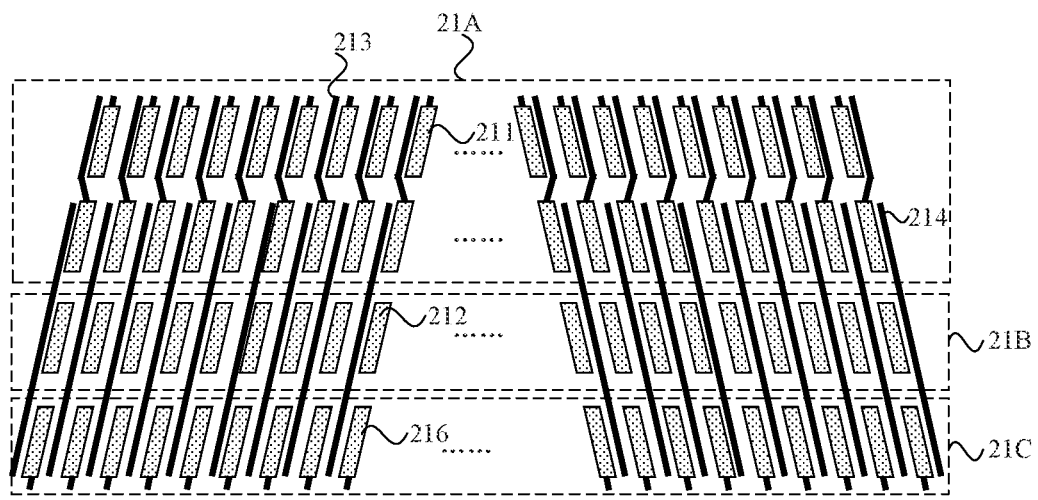
FIG. 27 and FIG. 28 are each another schematic structural view of the bonding area in FIG. 2 respectively.
Figure 28:
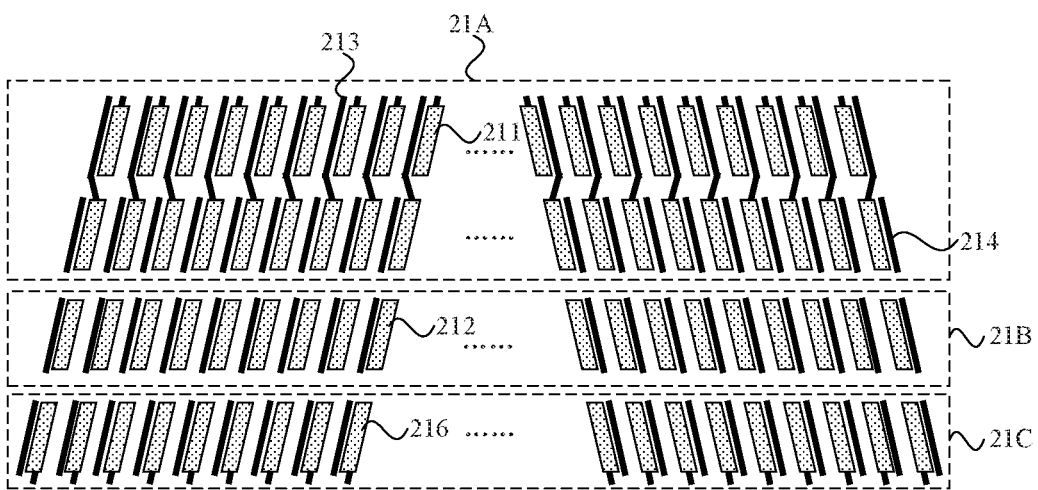

It is to be understood that the driving chip generally includes input ends and output ends, and the schemes provided in the embodiments of the present disclosure are applicable to bonding pads corresponding to the input ends and the output ends of the driving chip. Exemplarily, FIG. 27 and FIG. 28 are each another schematic structural view of the bonding area in FIG. 2, respectively. Referring to FIG. 27 and FIG. 28, the bonding area further includes a third area 21C, and the third area 21C includes multiple third pads 216. In the specific implementation, the third pads 216 may be bonded to the input ends of the driving chip, the first pads 211 are bonded to the output ends of the driving chip, and multiple dummy traces 214 are arranged, so that the stability of bonding can be improved.

Figure 29:
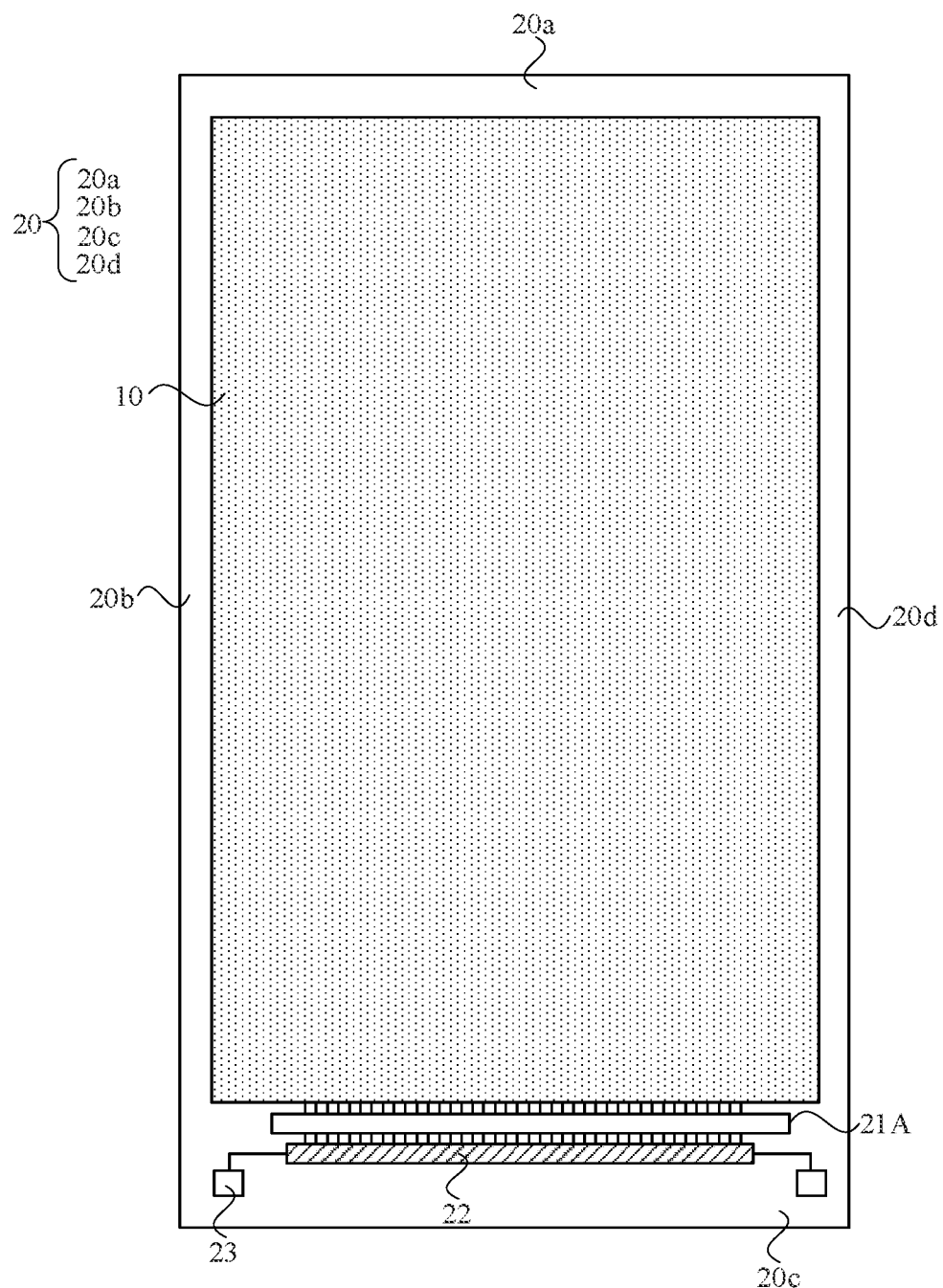
FIG. 29 is another schematic structural view of a display substrate according to an embodiment of the present disclosure.

FIG. 29 is another schematic structural view of a display substrate according to an embodiment of the present disclosure. Referring to FIG. 29, in an embodiment, the display substrate provided in this embodiment further includes a test circuit 22 and multiple test terminals 23 (only two test terminals are shown in FIG. 29), and the test circuit 22 is disposed on a side of the first area 21A away from the display area 10. Exemplarily, input ends of the test circuit 22 are electrically connected to the test terminals 23, and output ends of the test circuit 22 are electrically connected to the first pads (not shown in FIG. 29).

It is to be understood that in a manufacturing process of the display panel, after film layers of the display substrate are stacked, the screen already has an electric conduction display condition, and in this case, a VT test (a lighting test) is generally carried out, namely, the screen is powered by pricking the test terminals 23 on the display substrate to perform an electric test of the screen. In this embodiment, the test circuit 22 is disposed below the first area 21A (in the specific implementation, the test circuit 22 may be disposed between an input pad and an output pad of the driving chip). In this case, the second area (not shown in FIG. 29) may be disposed on both left and right sides of the first area 21A, which corresponds to the embodiments of FIGS. 3 to 23.

Figure 30:
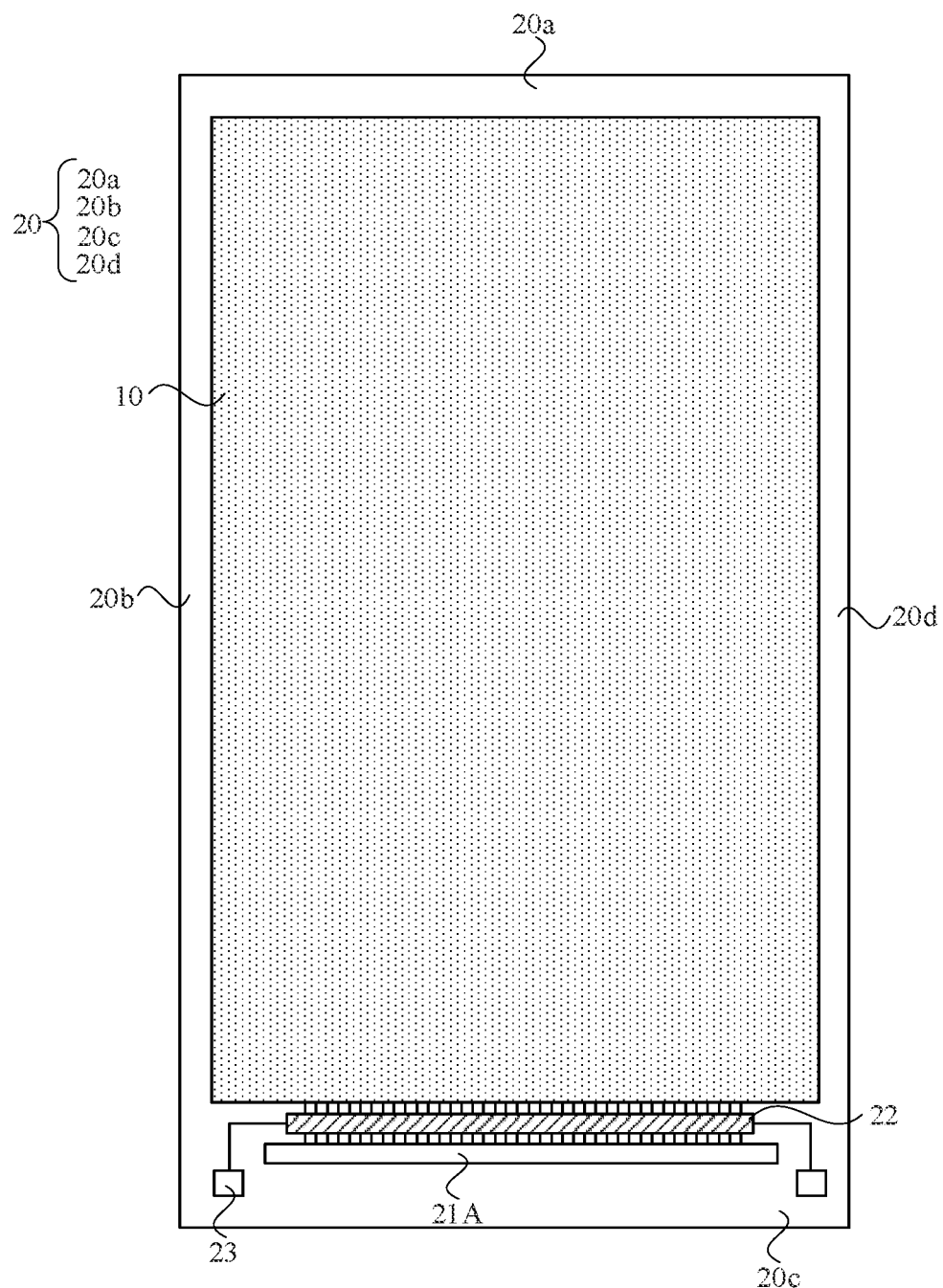
FIG. 30 is another schematic structural view of a display substrate according to an embodiment of the present disclosure.

In other embodiments, the test circuit may also be disposed between the first area and the display area. Exemplarily, FIG. 30 is another schematic structural view of a display substrate according to an embodiment of the present disclosure. Referring to FIG. 30, in an embodiment, the display substrate provided in this embodiment further includes a test circuit 22 and multiple test terminals 23, and the test circuit 22 is disposed between the first area 21A and the display area 10. Exemplarily, input ends of the test circuit 22 are electrically connected to the test terminals 23, and output ends of the test circuit 22 are electrically connected to the first signal lines and/or the second signal lines.

When the test circuit 22 is disposed above the first area 21A, the second area (not shown in FIG. 30) may be disposed below the first area 21A, which corresponds to the embodiments of FIGS. 25 and 26.

In any one of the display substrates provided in the embodiments described above, the dummy traces and the first signal lines are made of a same material. For example, a single layer or multiple layers of gold (Au), silver (Ag), copper (Cu), nickel (Ni), platinum (Pt), palladium (Pd), aluminum (Al), molybdenum (Mo), or chromium (Cr), or an alloy such as an aluminum (Al): neodymium (Nd) alloy, or molybdenum (Mo): tungsten (W) alloy may be adopted, which are not limited in the embodiments of the present disclosure.

In an embodiment, the dummy traces and the first signal lines are disposed on a same film layer. In the specific implementation, the dummy traces and the first signal lines may be on a same layer as a film layer of a certain electrode in the TFT and are formed by using a same manufacturing process, so that the process difficulty is reduced. In other embodiments, the dummy traces and the first signal lines may also be made of different materials and/or disposed on different film layers, which may be flexibly selected according to practical process conditions in the specific implementation.

An embodiment of the present disclosure further provides a display panel including any one of the display substrates provided in the above-described embodiments.

The display panel provided in the embodiment of the present disclosure may be a liquid crystal display panel. In this case, the display substrate is an array substrate of the liquid crystal display panel, and the liquid crystal display panel further includes a color filter substrate opposite to the array substrate and a liquid crystal layer disposed between the array substrate and the color filter substrate. The display panel may also be an organic light-emitting display panel, an organic light-emitting display structure is disposed on the display substrate, and the organic light-emitting display panel further includes an opposite substrate used for protecting the organic light-emitting structure. The display panel provided in the embodiment of the present disclosure includes any one of the display substrates provided in the above-described embodiments, so that the display panel has the same or corresponding effects as the display substrate.

Figure 31:
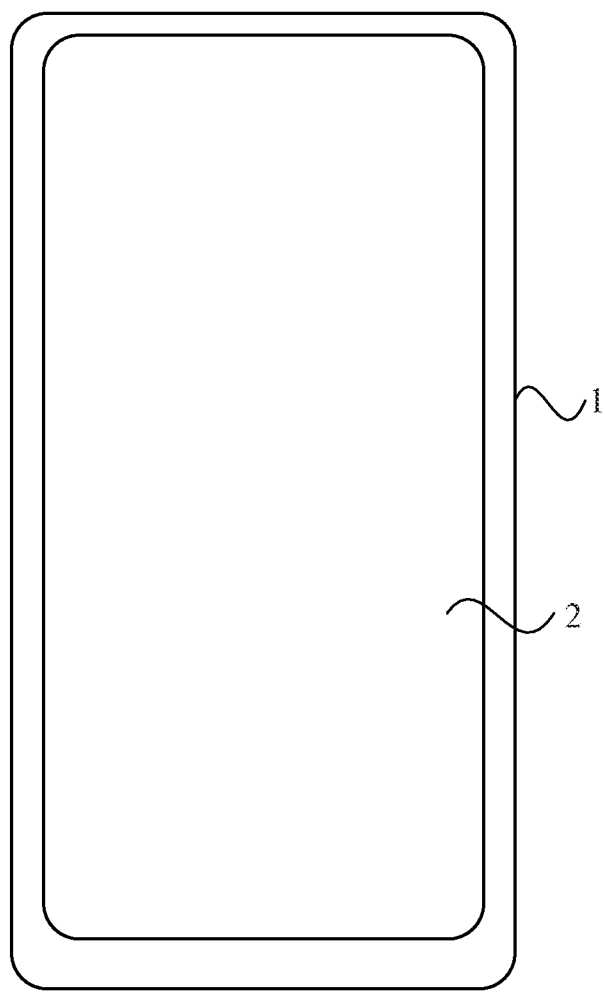
FIG. 31 is a schematic structural view of a display device according to an embodiment of the present disclosure.

FIG. 31 is a schematic structural view of a display device according to an embodiment of the present disclosure. Referring to FIG. 31, a display device 1 includes a display panel 2 provided in the embodiments of the present disclosure. The display device 1 may be a mobile phone, a computer, a smart wearable device and the like.

What is claimed is:

1. A display substrate, comprising:
    a display area and a bezel area, wherein the bezel area comprises a bonding area, the bonding area comprises a first area and a second area, the first area comprises a plurality of first pads, the second area comprises a plurality of second pads, the plurality of first pads are arranged into a first pad array with at least two rows and at least two columns, and the plurality of second pads are arranged into a second pad array with at least one row and at least two columns; and
    a plurality of first signal lines, wherein each of the plurality of first signal lines is electrically connected to a respective one of the plurality of first pads, and each of at least part of the plurality of first signal lines extends between respective two adjacent first pads;
    wherein each of the plurality of second pads is a dummy pad, or each of part of the plurality of second pads is electrically connected to a second signal line; and
    wherein the bonding area further comprises a plurality of dummy traces, and at least part area of a dummy trace is disposed between two adjacent first pads, and/or between two adjacent second pads, and/or between a first pad and a second pad adjacent to each other.

2. The display substrate of claim 1, wherein at least part of the plurality of dummy traces are electrically connected to the plurality of second pads.

3. The display substrate of claim 2, wherein a column direction of the first pad array is the same as a column direction of the second pad array, and an extension direction of the plurality of dummy traces is parallel to the column direction of the first pad array;
    a dummy trace disposed in a certain row of the first pad array or a certain row of the second pad array is electrically connected to a second pad disposed in a previous row; and/or
    a dummy trace disposed in a certain row of the first pad array or a certain row of the second pad array is electrically connected to a second pad disposed in a next row.

4. The display substrate of claim 1, wherein at least two of the plurality of second pads are electrically connected by at least one of the plurality of dummy traces.

5. The display substrate of claim 1, wherein a number of traces between two adjacent first pads is the same as a number of traces between two adjacent second pads.

6. The display substrate of claim 5, wherein traces between two adjacent first pads comprise at least one of the plurality of first signal lines, or the traces between two adjacent first pads comprise at least one of the plurality of dummy traces, or the traces between two adjacent first pads comprise at least one of the plurality of first signal lines and at least one of the plurality of dummy traces; and
    the traces between two adjacent second pads comprise a second signal line, or the traces between two adjacent second pads comprise at least one of the plurality of dummy traces, or the traces between two adjacent second pads comprise a second signal line and at least one of the plurality of dummy traces.

7. The display substrate of claim 1, wherein the plurality of dummy traces and the plurality of first signal lines are made of a same material.

8. The display substrate of claim 7, wherein the plurality of dummy traces and the plurality of first signal lines are disposed on a same film layer.

9. The display substrate of claim 1, wherein a length of part of the plurality of dummy traces is greater than or equal to a length of two rows of pads in at least one of the first pad array or the second pad array in a column direction.

10. The display substrate of claim 1, wherein the second area comprises a first sub-area and a second sub-area, the first sub-area is disposed on a first side of the first area, and the second sub-area is disposed on a second side of the first area; and the first sub-area, the first area and the second sub-area are sequentially arranged in a row direction of the first pad array.

11. The display substrate of claim 1, wherein the second area is disposed on a side of the first area away from or close to the display area.

12. The display substrate of claim 1, further comprising: a test circuit and a plurality of test terminals, the test circuit is disposed on a side of the first area away from the display area, input ends of the test circuit are electrically connected to the plurality of test terminals, and output ends of the test circuit are electrically connected to the plurality of first pads.

13. The display substrate of claim 1, further comprising: a test circuit and a plurality of test terminals, the test circuit is disposed between the first area and the display area, input ends of the test circuit are electrically connected to the plurality of test terminals, and output ends of the test circuit are electrically connected to the plurality of first signal lines and/or connected to a second signal line.

14. A display panel, comprising:
a display substrate, wherein the display substrate comprises:
a display area and a bezel area, wherein the bezel area comprises a bonding area, the bonding area comprises a first area and a second area, the first area comprises a plurality of first pads, the second area comprises a plurality of second pads, the plurality of first pads are arranged into a first pad array with at least two rows and at least two columns, and the plurality of second pads are arranged into a second pad array with at least one row and at least two columns; and
a plurality of first signal lines, wherein each of the plurality of first signal lines is electrically connected to a respective one of the plurality of first pads, and each of at least part of the plurality of first signal lines extends between respective two adjacent first pads;
wherein each of the plurality of second pads is a dummy pad, or each of part of the plurality of second pads is electrically connected to a second signal line; and
wherein the bonding area further comprises a plurality of dummy traces, and at least part area of a dummy trace is disposed between two adjacent first pads, and/or between two adjacent second pads, and/or between a first pad and a second pad adjacent to each other.

15. The display panel of claim 14, wherein at least part of the plurality of dummy traces are electrically connected to the plurality of second pads.

16. The display panel of claim 15, wherein a column direction of the first pad array is the same as a column direction of the second pad array, and an extension direction of the plurality of dummy traces is parallel to the column direction of the first pad array;
a dummy trace disposed in a certain row of the first pad array or a certain row of the second pad array is electrically connected to a second pad disposed in a previous row; and/or
a dummy trace disposed in a certain row of the first pad array or a certain row of the second pad array is electrically connected to a second pad disposed in a next row.

17. The display panel of claim 14, wherein at least two of the plurality of second pads are electrically connected by at least one of the plurality of dummy traces.

18. The display panel of claim 14, wherein a number of traces between two adjacent first pads is the same as a number of traces between two adjacent second pads.

19. The display panel of claim 18, wherein traces between two adjacent first pads comprise at least one of the plurality of first signal lines, or the traces between two adjacent first pads comprise at least one of the plurality of dummy traces, or the traces between two adjacent first pads comprise at least one of the plurality of first signal lines and at least one of the plurality of dummy traces; and
the traces between two adjacent second pads comprise a second signal line, or the traces between two adjacent second pads comprise at least one of the plurality of dummy traces, or the traces between two adjacent second pads comprise a second signal line and at least one of the plurality of dummy traces.

20. A display device, comprising:
a display panel, wherein the display panel comprises a display substrate and the display substrate comprises:
a display area and a bezel area, wherein the bezel area comprises a bonding area, the bonding area comprises a first area and a second area, the first area comprises a plurality of first pads, the second area comprises a plurality of second pads, the plurality of first pads are arranged into a first pad array with at least two rows and at least two columns, and the plurality of second pads are arranged into a second pad array with at least one row and at least two columns; and
a plurality of first signal lines, wherein each of the plurality of first signal lines is electrically connected to a respective one of the plurality of first pads, and each of at least part of the plurality of first signal lines extends between respective two adjacent first pads;
wherein each of the plurality of second pads is a dummy pad, or each of part of the plurality of second pads is electrically connected to a second signal line; and
wherein the bonding area further comprises a plurality of dummy traces, and at least part area of a dummy trace is disposed between two adjacent first pads, and/or between two adjacent second pads, and/or between a first pad and a second pad adjacent to each other.

* * * * *